US006458507B1

(12) United States Patent
Burberry et al.

(10) Patent No.: US 6,458,507 B1
(45) Date of Patent: Oct. 1, 2002

(54) PLANOGRAPHIC THERMAL IMAGING MEMBER AND METHODS OF USE

(75) Inventors: Mitchell S. Burberry; David B. Bailey, both of Webster, NY (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/531,117

(22) Filed: Mar. 20, 2000

(51) Int. Cl.$^7$ ............................ G03F 7/038; G03F 7/09

(52) U.S. Cl. ................................ 430/270.1; 430/272.1; 430/302; 430/303; 430/348; 430/944; 430/945; 101/453; 101/467

(58) Field of Search ........................... 430/270.1, 272.1, 430/302, 303, 348, 944, 945, 964; 101/454, 462, 467

(56) References Cited

U.S. PATENT DOCUMENTS

| | | | | | |
|---|---|---|---|---|---|
| 3,953,212 | A | * | 4/1976 | Mlyano et al. | 96/75 |
| 4,034,183 | A | | 7/1977 | Uhlig | 219/122 |
| 4,081,572 | A | | 3/1978 | Pacansky | 427/53 |
| 4,405,705 | A | | 9/1983 | Etoh et al. | 430/270 |
| 4,634,659 | A | | 1/1987 | Esumi et al. | 430/302 |
| 4,693,958 | A | | 9/1987 | Schwartz et al. | 430/302 |
| 4,718,340 | A | | 1/1988 | Love, III | 101/116 |
| 5,278,126 | A | | 1/1994 | Katano et al. | 503/201 |
| 5,339,737 | A | | 8/1994 | Lewis et al. | 101/454 |
| 5,351,617 | A | | 10/1994 | Williams et al. | 101/467 |
| 5,353,705 | A | | 10/1994 | Lewis et al. | 101/453 |
| 5,379,698 | A | | 1/1995 | Nowak et al. | 101/454 |
| 5,385,092 | A | | 1/1995 | Lewis et al. | 101/467 |
| 5,455,142 | A | * | 10/1995 | Takahashi et al. | 430/254 |
| 5,487,338 | A | | 1/1996 | Lewis et al. | 101/454 |
| 5,512,418 | A | | 4/1996 | Ma | 430/271.1 |
| 5,713,287 | A | | 2/1998 | Gelbart | 101/467 |
| 5,952,429 | A | * | 9/1999 | Ikeda et al. | 525/326.1 |
| 6,022,668 | A | * | 2/2000 | Burberry et al. | 430/302 |
| 6,040,115 | A | * | 3/2000 | Bailey et al. | 430/303 |
| 6,228,559 | B1 | * | 5/2001 | Oda | 430/272.1 |
| 6,284,433 | B1 | * | 9/2001 | Ichikawa et al. | 430/303 |
| 6,326,126 | B1 | * | 12/2001 | Gries | 430/286.1 |
| 6,399,268 | B1 | * | 6/2002 | Fleming et al. | 430/270.1 |
| 2001/0033981 | A1 | * | 10/2001 | Takagi et al. | 430/18 |
| 2002/0009672 | A1 | * | 1/2002 | Daems et al. | 430/273.1 |

FOREIGN PATENT DOCUMENTS

| | | |
|---|---|---|
| EP | 0 652 482 | 5/1995 |
| EP | 0 924 102 | 6/1999 |
| EP | 0847853 | 1/2001 |
| GB | 1 489 308 | 3/1975 |
| WO | WO 92/07716 | 5/1992 |
| WO | WO 92/09934 | 6/1992 |
| WO | WO 94/18005 | 8/1994 |
| WO | 9938688 | 8/1999 |
| WO | 9938705 | 8/1999 |
| WO | WO 01/70502 A2 * | 9/2001 |

* cited by examiner

*Primary Examiner*—Janet Baxter
*Assistant Examiner*—Barbara Gilliam
(74) *Attorney, Agent, or Firm*—Baker Botts L.L.P.

(57) ABSTRACT

A thermally sensitive imaging member can be imaged using thermal energy such as from an IR-emitting laser and then used for lithographic printing. The imaging member includes a support having an ink-repellant subbing layer and a thermally sensitive, ink-repellant surface imaging layer. Imaging causes a "switching" in the exposed surface regions to a more oleophilic or ink-accepting nature. Post-imaging processing is unnecessary in this imaging system. The surface imaging layer includes a thermally sensitive copolymer of silicone "soft" segments and thermally sensitive "hard" segments as well as a photothermal conversion material that is IR radiation sensitive.

26 Claims, 1 Drawing Sheet

PLANOGRAPHIC THERMAL IMAGING MEMBER AND METHODS OF USE

FIELD OF THE INVENTION

This invention relates in general to lithographic imaging members suitable for on- or off-press imaging, and particularly to waterless imaging members that require no wet processing or wiping after imaging. This invention also relates to a method of imaging such imaging member using for example digital means and to a method of printing with the imaged members.

BACKGROUND OF THE INVENTION

Very common lithographic printing plates include a metal or polymeric support having thereon an imaging layer that is sensitive to visible or UV light. Both positive- and negative-working printing plates can be prepared in this fashion. After exposure to a light source, and possibly to a heat source, either imaged or non-imaged areas are removed using wet processing chemistries.

Thermally sensitive printing plates are becoming more common and are available at least from Kodak Polychrome Graphics. Such imaging members include an imaging layer comprising a mixture of dissolvable polymers and an infrared radiation-absorbing compound. While these imaging members can be imaged using digital means (such as lasers) and can be utilized in what is known as "computer-to-press" imaging systems, they still require post-imaging wet processing using alkaline developer solutions.

Dry planography or waterless printing is well known in the art of lithographic offset printing and has several advantages over conventional offset printing. Dry planography is particularly advantageous for short run and on-press applications. It simplifies press design by eliminating the fountain solution and aqueous delivery train. Careful ink water balance is unnecessary, thus reducing rollup time and material waste.

An unexposed waterless printing plate typically comprises a layer of ink repellent material over a layer of ink accepting material or an ink-accepting surface. Because of their low surface energies and their ability to swell in the long-chain alkane solvents used in printing inks, silicone rubbers, such as poly(dimethylsiloxane) (identified herein as "PDMS") and other derivatives of poly(siloxanes), have long been recognized as preferred waterless-ink repelling materials. Preparation of the printing plates involves the imagewise removal of the ink repellent silicone rubber to expose the underlying ink accepting material or surface.

Various methods of removing the silicone rubber layer have been developed. Imaging of dry planographic printing plates with infrared lasers has been described in Canadian Patent 1,050,805 (Eames) and by Nechiporenko and Markova, "Advances in Printing Science and Technology," *Proceedings of the* 15$^{th}$ *International Conference of Printing Research Institutes*, June 1979, Pentech Press, London, pp. 139–148. The silicone rubber layer is coated over a heat-absorbing layer containing an infrared absorbing material in nitrocellulose. Imagewise exposure with an infrared laser partially disrupts the heat-absorbing layer, allowing it and the overlying silicone layer to be removed from the exposed regions with a solvent.

Infrared imaging of printing plates with "ablatable" layers has also been described in U.S. Pat. No. 4,718,340 (Love III), WO 92/07716 (Landsman), WO 94/18005 (Verburgh et al), U.S. Pat. No. 5,379,698 (Nowak et al), U.S. Pat. No. 5,310,869 (Lewis), U.S. Pat. No. 5,339,737 (Lewis et al), U.S. Pat. No. 5,385,092 (Lewis et al), U.S. Pat. No. 5,351,617 (Williams), U.S. Pat. No. 5,353,705 (Lewis et al) and U.S. Pat. No. 5,487,338 (Lewis). These documents describe the use of direct digital imaging on-press or a platesetter.

In each of these methods, mechanical wiping or washing with liquids is required to remove the silicone rubber debris clinging to the plate after exposure. This problem arises because of the conflicting needs to have wear-resistant silicone layers for long press runs while maintaining the ease of layer removal during thermal imaging. Wiping has several drawbacks. It is difficult to reproducibly remove all stray material with automated cleaning stations. Moreover, wiping can scratch or abrade the printing plate.

A truly processless printing plate, that is one that does not require a separate processing step to remove the silicone rubber debris after imaging, would have several advantages. The post-imaging development or wiping step would be eliminated, simplifying the process for preparing the printing plate. In addition, any scratching or abrading of the plate surface caused by development would be eliminated. If desired, the plate could be exposed on the printing press, eliminating any potential damage to the plate caused by handling and mounting on the press after imaging.

There are three key requirements for an ink repellent polymer to be useful for a thermally imageable processless printing plate that is imaged using ablation. The ink repellent polymer must form a solid film at room temperature to resist damage from the press. It also must release ink, and must be easily removed by the imaging step alone or by the normal action of the press after imaging.

U.S. Ser. No. 08/749,050 (filed Nov. 14, 1996 by Bailey et al) discloses a class of silicone copolymers that exhibit these desirable attributes. The plates prepared using those copolymers can be imaged and used to print many thousands of impressions. Unfortunately such printing plates still suffer from the conflicting need to be durable on press but readily thermally imaged without the need for wiping or washing. Optimum exposure for ablation plates is therefore relatively high, leading to undesirable system costs in power and time.

One approach toward processless, non-ablation waterless printing plates involves the use of "switchable" polymers. These polymers will undergo thermally driven chemical reactions in which ink accepting or rejecting characteristics are either created or destroyed under imaging conditions. In addition to not needed wet processing, such plates have the advantage of not needing any type of material collection devices that ablation-based plates require.

Although a number of switchable polymer-based printing plates are known, there remain technical barriers towards the utilization of this technology in commercially feasible products. Three difficulties commonly experienced in the design switchable polymer-based plates are physical wear of the plates and the related problems of background toning and blanket toning.

In switchable polymer-based printing plates, a major challenge lies in the creation of a thin synthetic polymer surface that has both adequate physical toughness and resistance to toning. A need exists in the industry for a thermally imageable processless and waterless imaging member in which the ink repellent surface layer is a polymer that is wear resistant and readily imaged by "switching" without the problems usually encountered with prior art materials.

SUMMARY OF THE INVENTION

The problems noted above have been overcome with a thermal imaging member comprising a support having thereon:

(a) an ink-repellant subbing layer that is swellable in waterless ink solvents, and (b) an ink-repellant, thermally sensitive imaging layer that comprises a photothermal conversion material and a thermally sensitive copolymer comprising one or more silicone segments and one or more thermally sensitive "hard" segments, the silicone segments comprising from about 50 to about 99 weight % of the copolymer, the imaging layer being capable of becoming ink-accepting upon exposure to thermal energy.

This invention also provide a method of imaging comprising:

A) providing the imaging member described above, and

B) imagewise exposing the imaging layer of the imaging member to thermal energy to provide exposed and unexposed areas in the imaging layer whereby the exposed areas are rendered more oleophilic than the unexposed areas by the thermal energy.

Further, this invention provides a method of printing comprising steps A and B noted above and:

C) inking the imaging layer and imagewise transferring the ink to a receiving material.

The imaging members of this invention provide several advantages. They require relatively low thermal exposure during imaging. Furthermore, nothing must be removed from the imaging member because the surface layer "switches" in its affinity to ink solvents and the ablation processes are avoided. As a result, the imaging method does not require a wiping step or washing with liquids. Thus, the imaging members can be directly imaged using digital information supplied for example using a laser. They have high writing sensitivity, high image quality, short roll up time and long run length.

The surface imaging layer includes a thermally sensitive copolymer having silicone segments and thermally sensitive "hard" segments. These "hard" segments provide physical integrity and thermal sensitivity while the silicone segments provide ink releaseability. The balancing of relative amounts of these segments provides all of the desired properties for the imaging layer.

While the surface layer is relatively thin, it is also highly durable after imaging and highly sensitive to the thermal energy so that the exposed areas become more oleophilic and ink accepting during imaging. The surface imaging layer provides a good balance of physical toughness and resistance to scumming and blanket toning while having the desired thermal sensitivity. The thermally sensitive copolymer can be formulated with a suitable photothermal conversion material to increase thermal sensitivity.

DETAILED DESCRIPTION OF THE INVENTION

Figure 1:
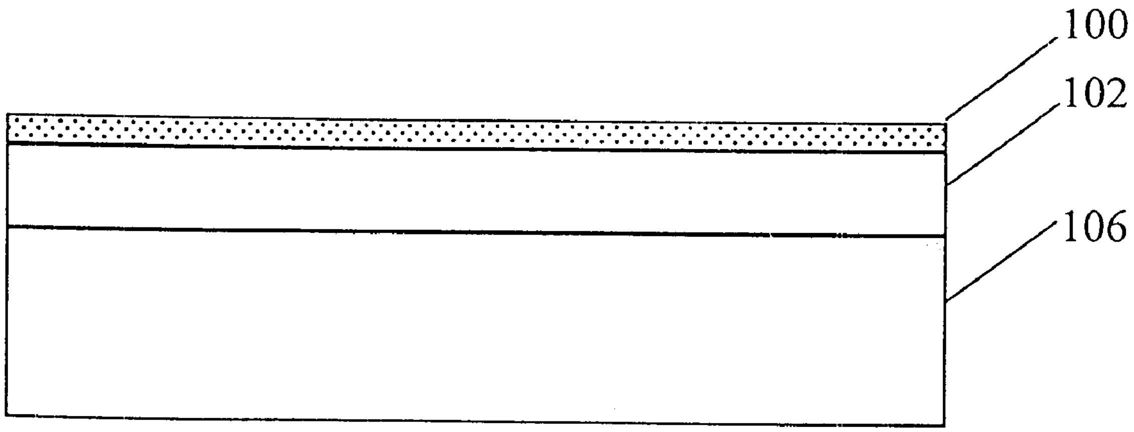
FIG. 1 is a highly schematic, cross-sectional view of one embodiment of the imaging members of this invention having a support and two supported layers.
Figure 2:
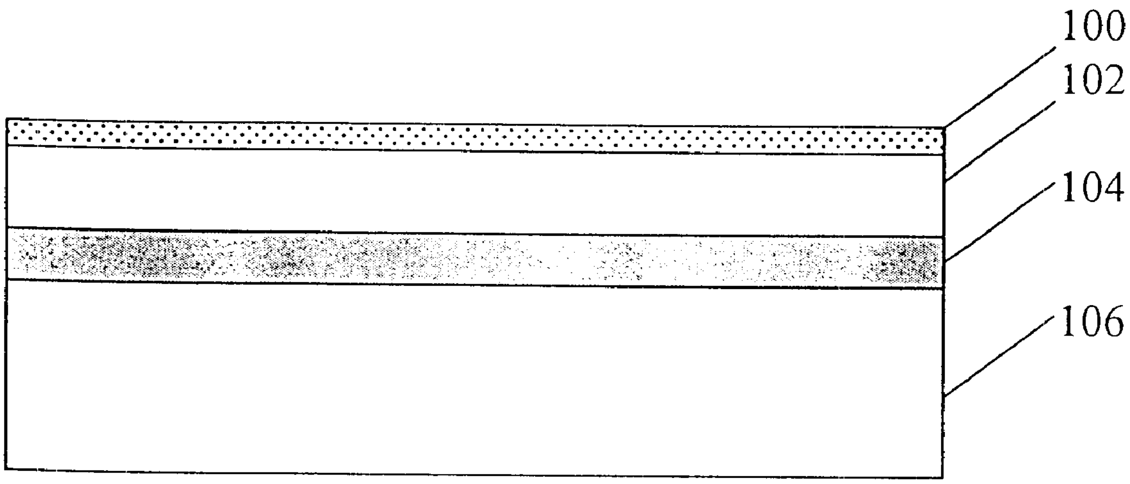
FIG. 2 is a highly schematic, cross-sectional view of another embodiment of the imaging members of this invention having a support and three supported layers.

A representative imaging member of this invention is illustrated in FIG. 1 as having support 106 having thereon ink-repellant subbing layer 102 and thin ink-repellant, thermally-sensitive surface layer 100. Another embodiment is shown in FIG. 2 as having support 106 having thereon adhesion-promoting layer 104, ink-repellant subbing layer 102 and ink-repellant, thermally-sensitive surface layer 100. Further details of these and other components of the imaging members of this invention are provided below.

Upon exposure to infrared radiation, the imaging layer is heated causing exposed regions to be more ink receptive. Those exposed regions thereby become more oleophilic than the unexposed regions, although the process of physical and or chemical switching is not fully understood. The net result of exposure is to produce ink-accepting areas surrounded by an ink-repellent background.

It is well known that the ink-repelling nature of PDMS layers depends not only on their intrinsic properties (that is polymer composition) but also on extrinsic properties (that is how thick the layer is). Thin layers of crosslinked PDMS (for example $\leqq 0.3$ μm) on an ink-accepting support such as a polyester support do not repel ink well. A salient feature of this invention is the ability of the ink-repellant subbing and imaging layers to swell in waterless ink solvent before exposure.

The various preferred features of the imaging members and methods of use are now described.

Support:

The thermal imaging members of this invention include a support that can be any self-supporting material including polymeric films, glass, ceramics, metals or stiff papers, or a lamination of any of these materials. The thickness of the support can vary depending upon the desired use and imaging and printing equipment used. In most applications, the thickness should be sufficient to sustain the wear from printing and thin enough to wrap around a printing form (or cylinder). A preferred support is composed of a polyester such as poly(ethylene terephthalate) (for example MYLAR polyester film sold by E.I. duPont de Nemours Co. and MELINEX polyester film sold by ICI Films) or poly (ethylene naphthalate) and has a thickness of from about 100 to about 310 μm. In another embodiment, the support is composed of a metal foil such as an aluminum foil having a thickness of from about 100 to about 600 μm. Thus, supports useful in the practice of the invention are strong, stable and flexible. Paper substrates are typically "saturated" or coated with polymers to impart water resistance, dimensional stability and strength.

The support can be coated or treated in suitable fashion to improve adhesion of upper layers. For example, a subbing or adhesion-promoting layer can be used, such layer being composed of materials such as alkoxysilanes, aminopropyltriethoxysilane, glycidoxypropyltriethoxysilane and epoxy functional polymers, as well as conventional subbing layer materials used on polyester supports for photographic silver halide films and papers. One or more IR radiation reflecting layers, such as layers of evaporated metals, can also be incorporated between the support and the thermally sensitive imaging layer. The backside of the support may be coated with antistatic agents, slipping layers or matte layers to improve handling or "feel" of the imaging member.

The imaging member comprises at least two coextensive layers on the support. By "coextensive" is meant that they cover essentially the same area of the support. The coextensive ink-repellant subbing layer is nearest the support, and the ink-repellant surface imaging layer is located above that subbing layer and is usually contiguous or adjacent thereto.

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite layers disposed on a suitable support. Printing cylinders and sleeves are known as rotary printing members having the support and heat-sensitive layer in a cylindrical form. Hollow or solid metal cores can be used as substrates for printing sleeves.

Thermally Sensitive Surface Imaging Layer:

The thermally sensitive imaging layer includes one or more thermally sensitive copolymers containing both "hard" and "soft" (silicone) segments. This layer comprises a copolymer of soft silicone segments (S) linked to hard segments (H) as represented by the following Structure I:

—H—S— I

The S segment is swellable in a lithographic ink solvent, contributes to the overall copolymer the property of ink release and is preferably a polysiloxane of the following general Structure II:

II

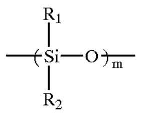

wherein "m" designates the size of the siloxane polymer and can be 5 to 10,000 and $R_1$ and $R_2$ define the form of the siloxane polymer, and can be independently suitable organic radicals including, but not limited to, substituted or unsubstituted alkyl group of 1 to 20 carbons (such as methyl, ethyl, isopropyl, trifluoromethyl and cyanoalkyl), substituted or unsubstituted aryl groups of 6 to 10 carbon atoms in the aromatic ring (such as phenyl, napthyl and p-methylphenyl), and long ether sequences such as repeating oxyalkylene groups. While mostly linear, there can be branching points or additional functional groups associated with these $R_1$ and $R_2$ groups.

Preferably, $R_1$ and $R_2$ are independently substituted or unsubstituted alkyl of 1 to 4 carbon atoms and more preferably, each is substituted or unsubstituted methyl.

Examples of particularly useful S segments are polydimethylsiloxane and polymethy phenyl siloxane. S segments generally comprise from about 50% to about 99% (preferably from about 80 to about 99%) of the copolymer based on the total copolymer weight.

The structures of the S segments can be siloxane polymers as described above. In addition to the siloxane groups, the S segment may contain terminal or pendant X linking groups that facilitate the coupling of S segments to H segments. The nature, location and number of these linking groups depends upon the specific chemistry used to build H segments and the specific architecture desired in the copolymers. Useful X linking groups include, but are not limited to, aminoalkyl and hydroxyalkyl groups wherein the alkyl portion (linear or branched) has for example from 1 to 6 carbon atoms. A preferred linking group is an aminopropyl group.

With regards to location and number, the X linking groups can be attached as terminal groups shown as follows in Structure III:

III

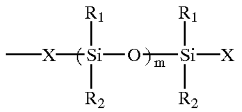

or as pendant groups shown as follows in Structure IV below wherein m and c(a+b) designate the size of the silicone and c designates the number of pendant groups. $R_1$ and $R_2$ are as defined above, and $R_3$ is the same as $R_1$ or $R_2$.

IV

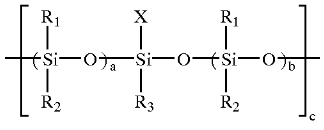

Diblock copolymers of S and H segments would have one terminal X linking group, triblocks with an H segment at the center would have one terminal X linking group on the silicone, triblocks with a S segment at the center or multiblock sequences would have two terminal X linking groups on the silicone. Graft copolymers with S segments side chains would have one terminal X linking group. Graft copolymers having H segments as the side chain would have one or more pendant X linking groups depending on the number of H segment side chains. Combinations of the above may be used to achieve more complex structures in which case multiple locations for X and a variety of different functional groups may be used. The identity of the functional groups will depend upon the chemistry of the H segments as described below.

Silicone polymers are widely used in waterless printing applications because they release ink. However, silicone polymer films in the uncrosslinked form are either fluids or gums and lack the physical properties needed for handling and printing. Therefore, silicones are generally crosslinked by a number of methods including reactions between silicone hydride and Si-vinyl, reactions between Si—OH or Si—OR groups, and other well known crosslinking chemistries. Although crosslinking imparts robust physical properties to the film, the resulting network is not readily broken down by heat. Therefore, the imaging layer containing the silicone segments exposed to laser imaging retains its integrity and is not altered enough to be easily removed.

The H segments of the copolymer useful in this invention generally comprise less than 50% on a weight basis of the copolymer and impart good physical properties and thermal sensitivity. The physical properties are a result of associations between the H segments that have the effect of crosslinking the copolymer. The associations may include high glass transition temperature (Tg) glassy domains, hydrogen bonding, ionic associations, crystallinity or combinations of these interactions. It may also include but does not necessarily require chemical bonds.

The second contribution of the H segments is thermal sensitivity. The noted H segment associations can break down at elevated temperatures more readily than the silicone chain or the silicone crosslinked bonds noted above. Therefore laser imaging can alter the nature of the layer and the resultant surface layer can have a different affinity for ink. The thermal breakdown of associations in the H segments may be due to glass to liquid transition (Tg), breakdown in hydrogen bonding, melting, and breaking of chemical bonds or combinations of these effects.

The —H—S— structure in the copolymer is intended to indicate the two components of the polymer and the properties they impart but does not limit the many ways they may be combined. Thus, the structure would include a diblock copolymer of —H—S—, triblock copolymers of —H—S—H— or —S—H—S—, or multiple sequences as in $(—H—S—)_n$ wherein "n" represents the number of sequences and can be from 0 to 20 (preferably 0 to 3). In addition, the S segments can be side chains attached to an H main segment, or there may be H side segments attached to an S main segment. The side or main chains may also be diblock, triblock or higher multiple sequences of H and S segments. Multi-armed star architectures where the arms are combinations of H and S segments are also contemplated.

The H segment can be derived from a variety of polymers including, but not limited to, polyurethanes, polyesters, polycarbonates, polyureas, polyimides, polyamic acid, polyamic acid salts, polyamides, epoxides from bisamines and bisepoxides, phenol formaldehyde, urea formaldehyde, melamine formaldehyde, epichlorohydrin-bisphenol A epoxides, carbodiimide polymers derived from bisisocyanates, and a wide variety of condensation polymers derived from pairs of difunctional monomers.

Preferred copolymers useful in the imaging layer can be represented below in Structure V in which AA and BB represent two difunctional monomers:

V

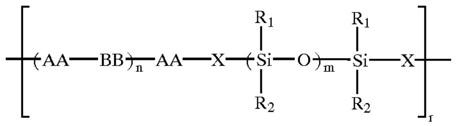

wherein "r" is at least 2, and $R_1$, $R_2$, "n" and "m" are as defined above.

In the case of polyurethanes, the resulting A-B linkages are urethanes, AA and BB are difunctional monomers derived from the isocyanate and alcohol parts of the urethane group. In the case of polyesters, the resultant A-B linkages are esters, AA and BB are difunctional monomers derived from the carboxylate and alcohol parts of the ester group. In other words, AA and BB are monomers having the same reactive groups in the molecule. Polyureas, polycarbonates, polyimides, polyamic acid analogue of the polyimide either as the free acid or in the salt of the acid form, polyamides, formaldehyde copolymers can be described in similar fashion. For carbodiimide polymers, AA and BB would both be diisocyanates. A mixture of AA groups and a mixture of BB groups may be used in any of these examples.

In these embodiments, the nature of the X linking group is dependent upon the composition of the H segment. X can be derived from an alkyl or aryl group attached to the silicon atom and contains additional functional groups capable of reacting with the corresponding AA group. Where AA is an isocyanate or carboxylate, X would be derived from an alkyl or aryl substituted with hydroxyl, amine or thiol groups. Where AA is an amine, the corresponding groups would contain an isocyanate, carboxylate or epoxy. Where AA is a hydroxyl or thiol, X would contain an isocyanate or carboxylate. Where AA is a methyoyl-substituted phenol, X would contain a phenolic or urea group. A variety of such materials are described in the Gelest catalogue (Gelest Inc. Tullytown, Pa.) for functional silicones and include aminopropyl, epoxypropoxypropyl, hydroxyalkyl, mercaptopropyl and carboxypropyl groups.

Condensation polymers can also be formed from monomers of the AB variety (that is having different reactive groups in the same molecule) that contain both of the functional groups needed to form the final polymers as shown below in Structures VI and VII. These include polyesters, polyamides, phenoxy resins, etc. Examples of such polymers are polyesters formed from p-hydroxybenzoic acid wherein A is the hydroxyl component and B is the carboxylate component. In this case, the coupling of an H segment to a S segment would require a mixture of Y and X on the siloxane wherein Y is a carboxylate reactive group such as hydroxyl, amine, thiol, epoxy and X is a hydroxyl reactive group such as carboxylate, isocyanate, etc. Alternatively, the H segments can be capped with a difunctional AA monomer to give an A-capped H segment capable of reacting with an X-functionalized S segment.

VI

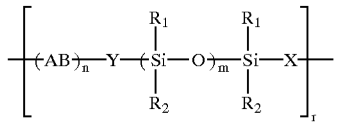

or

VII

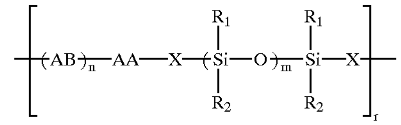

In the above structures "n" can be any integer (including 0 if at least one AA or BB is present in the H segment) up to 20 (preferably from 0 to 3) and "m" can range from 5 to 10,000 while "n" and "m" bear a relationship such that for large values of "n" and for large molecular weights of AA, BB, or AB, the substituents $R_1$ and $R_2$ on the silicone and "m" must be large enough to give the overall structure a silicone content of greater than 50% (of total copolymer weight). Structures VI and VII represent X and Y as terminal groups and H and S segments as a multiblock copolymer. Other architectures (graft, stars, branched or other block sequences) could also be present by using the appropriate number and location of X coupling groups on the silicone. In the case of highly substituted silicones, the final copolymer will have a branched structure or crosslinked structure and may, as a practical matter, have to be formed on the substrate during the film forming operation. In the case of linear polymers, "r" represents the multiplicity of the H—S repeating sequence or the overall molecular weight and can range from 1 to 100.

A wide variety of H segments can be prepared that are derived from vinyl monomers including acrylates, methacrylates, acrylic acid, methacrylic acid, cyanoacrylates, styrene, α-methylstyrene, vinyl esters, vinyl halides, vinylidene halides, maleic anhydride, maleimides, vinyl pyridine, olefins as well as copolymer mixtures of these monomers. Also, polymers derived from ring opening polymerization monomers such as cyclic ethers, lactams, lactones, and oxazolines, and from carbonyl monomers such as acetaldehyde and phthalaldehyde. These polymers and copolymers can be described by the general Structure VIII:

VIII

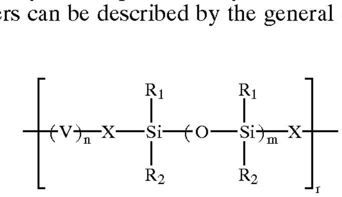

wherein $(V)_n$, represents a sequence derived from the above monomers and X represents the coupling of that sequence to the silicone segments.

The nature of X depends on the type of monomer and polymerization. In the case of anionic polymerization of the V monomers in Structure VIII, the growing V anion can initiate cyclic siloxane polymerization directly at the silicon atom in which case no X would be required. In the case of graft architecture, the anionic polymerization of siloxane could be terminated with a vinyl, aldehyde, ether or oxazoline functional group that would subsequently be copolymerized with a V monomer. Also, aminoalkyl terminated siloxanes could initiate the anionic polymerization of N-carboxyanhydrides or of cyanoacrylates. Carboxy- or hydroxy-terminated siloxanes could initiate polymerization of lactones. Alkyl halide terminated silicones could initiate oxazoline polymerizations. A wide variety of vinyl monomer could be polymerized where X represents a radical initiator (such as an azo or peroxide group) attached to the siloxane.

The more preferred embodiments of this invention will now be described in detail.

The ink-repellant, thermally sensitive imaging layer can comprise a copolymer of an S segment linked to an H segment as represented in Structure IX:

IX

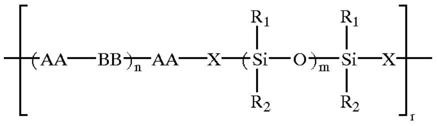

wherein AA is a diisocyanate and BB is a diol, n is 0 to 3 and $R_1$ and $R_2$ are methyl. The X linking group on the end of the silicone is $—CH_2CH_2CH_2NH_2$. The amine group reacts with AA to couple the H and S segments. The illustrated structure is repeated "r" times to produce a higher molecular weight copolymer. Additional examples of AA and BB are listed below. The relative amounts of silicone to non-silicone can be adjusted by lengthening or shortening either the number of siloxane repeating units ("m") or the number of urethane repeating units ("n"). The silicone segment can be of molecular weight greater than 400 and can be a combination of different molecular weights. The upper end of the silicone molecular weight range is limited only by the reliability of attaching at least one (preferably two or more) reactive X linking groups to the chain, either as terminal or pendant functional groups. The silicone is predominately dimethylsiloxane but may contain substituents other than methyl, including but not limited to, phenyl, fluoroalkyl, cyanoalkyl, or long ether sequences groups, to adjust physical properties such as Tg.

The urethane portion of the copolymer need not be entirely bisphenol and diisocyanate and may be filled with a wide variety of diols or diamines that may be monomeric, oligomeric or polymeric.

The copolymer structure may be branched or crosslinked if multifunctional reactants are used. In this case, solution gelation would be avoided by completing the reaction during the drying step. Excess multifunctional isocyanates can be added to react with the urethane or urea linkages to give allophonate or biuret crosslinks. Crosslinking of the silicone segments can be achieved by any one many functional chemistries as described above.

Examples of AA groups include but are note limited to 1,6-hexamethylenediisocyanate (HMDI), 4,4'-diphenylmethane diisocyanate (MDI), 4,4' dicyclohexylmethane diisocyanate (RMDI), 1-isocyanato-3-isocyanatomethyl-3,5,5-trimethyl-cyclohexane (IPDI), 2,4 and 2,6-toluene diisocyanate (TDI) and other well known aliphatic and aromatic di- and multifunctional isocyanates.

Examples of BB include but are not limited to 4,4'-isopropylidenediphenol (GH), 4,4'-isopropylidenebis(2,6-dichlorophenol) (TCBA), 4,4'-isopropylidenebis(2,6-dibromophenol), 4,4'-isopropylidenebis(2-hydroxyethoxybenzene) (AE), 4,4'-(octahydro-4,7-methano-5H-inden-5-ylidene) bis(2-hydroxyethoxybenzene) (GY), and

GK

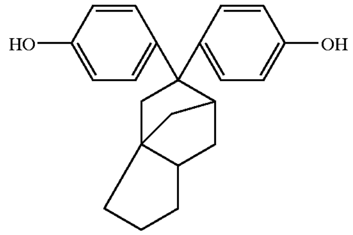

A particularly preferred copolymer useful in the present invention is represented by Structure X:

X

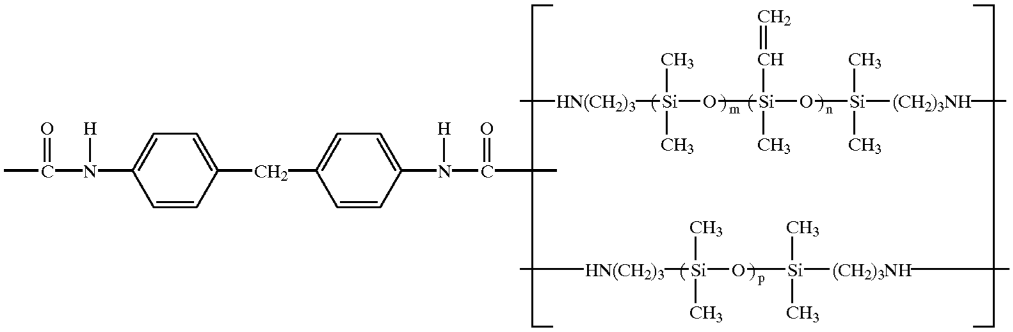

wherein the disocyanate is based on MDI, m is 225, n has an average value of 0.8 and p is 12. In this particular embodiment, the H segment does not contain any diol (r is 0) and the S segment is a combination of two silicones of different chain lengths and compositions. The X linking group on the end of the silicone is $—CH_2CH_2CH_2NH_2$.

A detailed description of the preparation of the preferred copolymer is as follows, but it should be understood that other copolymers useful herein can be similarly prepared.

The noted copolymer of Structure X was prepared by slowly adding a solution of MDI (16.53 g) in a toluene/tetrahydrofuran mixture (500 ml:50 ml) to a mixture of bisaminopropylsilicone (543 g, Mn is 16,400, 0.036 mole % vinyl repeating units) and a shorter bisaminopropylsilicone (DMS-A11, Gelest, 30 g, Mn is 900, no vinyl groups) in 3 liters of toluene. The solution was then heated to 60° C. to offset the viscosity increase that occurred during MDI addition. The addition time was approximately 2 hours. The final concentration of the copolymer was 16.2% w/w and its molecular weight was 190,000.

The thermally sensitive imaging layer also includes one or more photothermal conversion materials that are capable of converting light to heat and are also capable of aiding in the transformation or alteration of exposed areas. The photothermal conversion materials absorb appropriate radiation from an appropriate energy source (such as an IR laser) converting the energy into heat. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful.

A wide range of such materials is well known and suitable for use in the imaging members of this invention. For example, materials that are useful with laser-induced thermal reactions are known in the art and described for example in U.S. Pat. No. 4,912,083 (Chapman et al), U.S. Pat. No. 4,942,141 (DeBoer et al), U.S. Pat. No. 4,948,776 (Evans et al), U.S. Pat. No. 4,948,777 (Evans et al), U.S. Pat. No. 4,948,778 (DeBoer), U.S. Pat. No. 4,950,639 (DeBoer et al), U.S. Pat. No. 4,952,552 (Chapman et al), U.S. Pat. No. 4,973,572 (DeBoer) and U.S. Pat. No. 5,036,040 (Chapman et al). Any of these photothermal conversion materials can be used in the present invention. Pigments are preferred over amorphous dyes. In a preferred embodiment, carbon black particles were found to work particularly well.

Carbon blacks that are surface-functionalized with solubilizing groups are well known in the art and these types of materials are preferred photothermal conversion materials for this invention. Carbon blacks which are grafted to hydrophilic, nonionic polymers, such as FX-GE-003 (manufactured by Nippon Shokubai), or which are surface-functionalized with anionic groups, such as CAB-O-JET®200 or CAB-O-JET®300 (manufactured by the Cabot Corporation) are especially preferred. Carbon blacks available as Black Pearls 280 (Cabot) are especially preferred.

Mixtures of pigments and dyes, or both, can also be used. Useful infrared radiation absorbing dyes include those illustrated as follows:

IR Dye 1

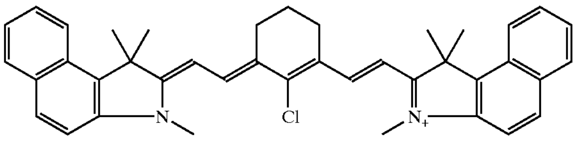

p-Toluenesulfate-

IR Dye 2

Same as Dye 1 but with a chloride anion.

IR Dye 3

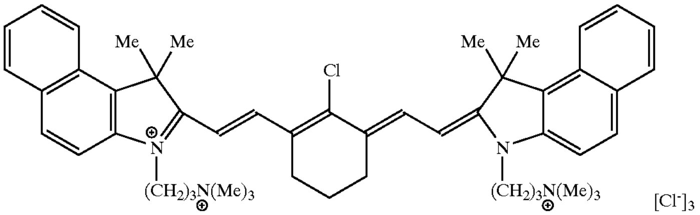

IR Dye 4

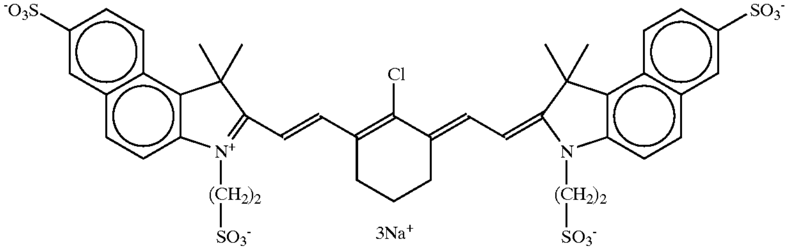

IR Dye 5

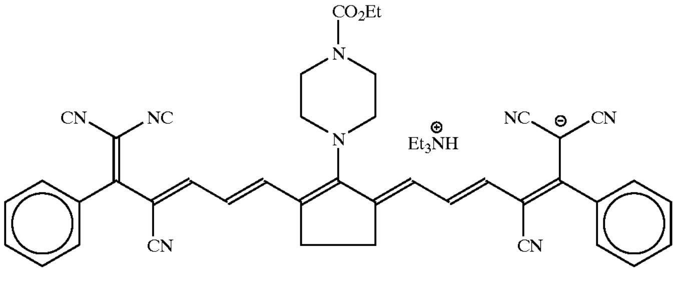

-continued

IR Dye 6

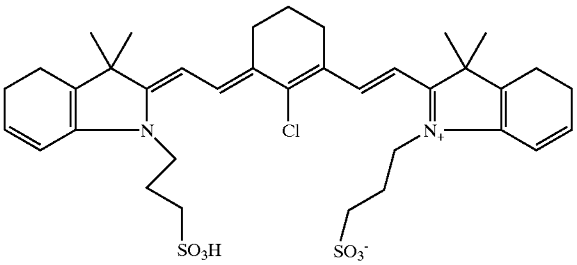

IR Dye 7

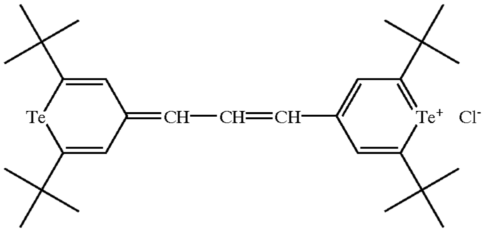

IR Dye 8

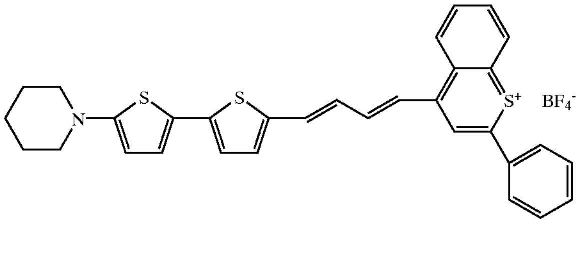

IR Dye 9

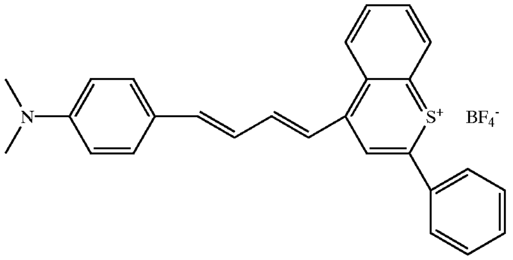

Useful oxonol compounds that are infrared radiation sensitive include Dye 5 noted above and others described in copending and commonly assigned U.S. Ser. No. 09/444,695, filed Nov. 22, 1999 by DoMinh et al.

The photothermal conversion material(s) are generally present in an amount sufficient to provide an optical density of at least 0.3 (preferably of at least 0.5 and more preferably of at least 1.0) at the operating wavelength of the imaging laser. The particular amount needed for this purpose would be readily apparent to one skilled in the art, depending upon the specific material used. Incorporation of the photothermal conversion material in the imaging layer in an appropriate concentration renders it sensitive to laser radiation and capable of generating an image by laser-induced thermal switching.

The surface imaging layer is relatively thin, typically having a thickness in the range of from about 0.01 to about 5 μm and more preferably in the range of from about 0.04 to about 0.5 μm.

The thermally sensitive imaging layer formulation can be applied to the subbing layer on a suitable support using any suitable equipment and procedure, such as spin coating, knife coating, gravure coating, dip coating or extrusion hopper coating, out of a suitable solvent such as 2-butanone, toluene or tetrahydrofuran. The formulation can also be applied by spraying onto a subbing layer that may be disposed on an on-press printing cylinder as described in U.S. Pat. No. 5,713,287 (Gelbart).

Subbing Layer:

The ink-repellant subbing layer is between the support and the surface imaging layer. The subbing layer is generally composed of crosslinked silicone polymers, poly(dimethylsiloxane) and other derivatives of poly(alkylsiloxanes) well known in the art of waterless printing such as those described in CA-1,050,805, and U.S. Pat. No. 5,310,869, 5,339,737, U.S. Pat. No. 5,385,092 and 5,487,338, all noted above and incorporated herein. These polymers may be straight or branched and can be crosslinked by any number of well-known chemistries such as hydrosilylation of vinyl-substituted siloxanes or alkoxy silane condensation.

This layer can also include one or more conventional surfactants for coatability or other properties, or dyes or colorants to allow visualization of the written image, or any other addenda commonly used in the lithographic art, as long as the concentrations are low enough so that there is no significant interference with the desired properties of the surface layer.

The dry thickness of the subbing layer is generally at least 0.5 μm, and preferably at least 1 μm. Generally, the dry thickness is no more than 20 μm and preferably no more than 5 μm.

The subbing layer can be applied to the support (or adhesion-promoting layer) using the conventional coating techniques and solvents described above for applying the surface imaging layer to the subbing layer.

Adhesion-promoting Layer:

Referring to FIG. 2, an optional layer 104 can be composed of any material that functions to improve adhesion of the subbing layer to the support. Examples of such materials include but are not limited to poly(vinyl chloride), poly(vinylidene chloride), poly(vinyl chloride-co-vinylidene chloride), chlorinated poly(propylene), poly(vinyl chloride-co-vinyl acetate), poly(vinyl chloride-co-vinyl acetate-co-maleic anhydride), ethyl cellulose, nitrocellulose, poly(acrylic acid) esters, linseed oil-modified alkyd resins, rosin-modified alkyd resins, phenol-modified alkyd resins, phenolic resins, poly(esters), poly(isocyanate) resins, poly(urethanes), poly(ureas), poly(vinyl acetate), poly(amides), chroman resins, gum damar, ketone resins, maleic acid resins, vinyl polymers such as poly(styrene) and poly(vinyltoluene) or copolymers of vinyl polymers with methacrylates or acrylates, low-molecular weight polyethylene, phenol-modified pentaerythritol esters, poly(styrene-co-indene-co-acrylonitrile), poly(styrene-co-indene), poly(styrene-co-acrylonitrile), copolymers with siloxanes, poly(alkenes) and poly(styrene-co-butadiene) all of which may be used either alone or in combination.

Polymers that are crosslinked or branched can also be used. For example, poly(styrene-co-indene-co-divinylbenzene), poly(styrene-co-acrylonitrile-co-divinylbenzene) or poly(styrene-co-butadiene-co-divinylbenzene) can be used for this purpose.

Coating of this layer can also be carried out using the coating methods and solvents described above for other layers in the imaging members.

Imaging Method:

The imaging method of this invention includes imagewise heating the imaging member preferably by means of a focused laser beam, and applying ink in a suitable manner. Ink is repelled from the regions of the imaging member that are not heated or imaged. The imaging members are then suitable for use with typical lithographic presses configured to print with waterless inks.

More particularly, the imaging member of this invention is exposed to a suitable source of energy that generates or provides heat, such as a focused laser beam or a thermoresistive head, in the foreground areas where ink is desired in the printed image, typically from digital information supplied to the imaging device. No additional heating, wet processing, or mechanical or solvent cleaning is needed before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (noted above), incorporated herein by reference. The imaging member is typically sensitized so as to maximize responsiveness at the emitting wavelength of the laser. For dye sensitization, the dye is typically chosen such that its $D_{max}$ closely approximates the wavelength of laser operation.

The imaging apparatus can operate on its own, functioning solely as a platesetter, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the imaging device (such as a laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the thermal energy source can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, the laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al). Thermal print heads are commercially available (for example, as Fujitsu Thermal Head FTP-040 MCS001 and TDK Thermal Head F415 HH7-1089).

Without the need for any wet processing after imaging, printing can then be carried out by applying a lithographic ink and fountain solution to the imaging member printing surface, and then transferring the ink to a suitable receiving material (such as cloth, paper, metal, glass or plastic) to provide a desired impression of the image thereon. If desired, an intermediate "blanket" roller can be used to transfer the ink from the imaging member to the receiving material. The imaging members can be cleaned between impressions, if desired, using conventional cleaning means.

The following examples illustrate the practice of the invention and are not meant to limit it in any way.

Methods and Materials for the Examples:

Exposure and Printing Conditions

All of the lithographic plates were exposed using an external lathe-type drum printer with a 450 mW per channel laser beam (830 nm), 9 channels per revolution, a spot size of approximately 25 μm×25 μm, recording at 2400 lines per inch (945 lines per cm) with a half step interline configuration and drum speeds between 300 and 900 rpm (revolutions per minute) corresponding to exposures of from 1500 to 350 mJ/cm$^2$, and having a drum circumference of 53 cm. These imaging conditions do not necessarily correspond to the optimum exposure for these samples.

Imaged printing plates were printed, without wiping or further processing, using a commercially available Heidelberg GTO offset press without the fountain roller or fountain solution. The waterless inks used were either K50-95932-Black (available from INX International, Rochester N.Y.), Kohl and Madden Sharp and Dry Waterless CTP Dense Black NA19944 or Kohl and Madden Sharp and Dry Waterless CTP Process Cyan as indicated below.

Subbing Layer Formulation

A typical subbing layer was prepared by adding the following components in the noted proportions: 5.1 g of a 10% solution of poly(dimethylsiloxane) vinyldimethyl terminated (PS225, United Chemical Technologies) in n-hexane, 0.51 g of a 0.2% solution of the catalyst [platinum-divinyltetramethyldisiloxane complex (SIP6831.0, Gelest Inc.)] in 2-butanone, 0.51 g of a 10% solution of inhibitor [3-methyl-1-pentyn-3-ol (Aldrich)] in 2-butanone and 2.5 g of a 10% solution of a polymer crosslinker [PS120 (United Chemical Technologies)] in 2-butanone to 26.3 g of n-hexane. This formulation was coated onto a 100 μm polyethylene terephthalate support using a syringe pump and translating slot hopper at 21.6 ml/m$^2$. All samples were cured in an oven for 10 minutes at 100° C. after the surface imaging layer was applied.

Thermally sensitive Imaging Layer Formulation

The copolymers used are based upon Structure X (noted above). In particular, Polymer HS98 had the following characteristics: m was 225, n was 0.8 (Average Value), Mn of silicone #1 was 16,700, p was 12, Mn of silicone #2 was 900, and an overall copolymer molecular weight of 190,000. Polymer HS104 had the following characteristics: m was 435, n was 1.6 (Average Value), Mn of silicone #1 was 32,400, p was 12, Mn of silicone #2 was 900, and an overall copolymer molecular weight of 344,000.

A carbon black dispersion was prepared by adding 82.9 g of a 16.2% solution of Polymer HS98 in toluene, 6.7 g of carbon black (see examples below) and about 200 g of 2 mm zirconium oxide XR beads (Zircoa Inc.) to 60.4 g of 2-butanone. The dispersion was placed on a roller-mill for about 36 hours then course filtered to remove the grinding media.

Thermally sensitive Imaging Layer

An imaging layer was prepared by mixing the following components; 2.3 g of the copolymer plus carbon-black dispersion described above, 0.3 g of a 0.2% solution of the catalyst [platinum-divinyltetramethyldisiloxane complex (SIP6831.0, Gelest Inc.)] in 2-butanone, 0.07 g of a 10% solution of inhibitor [3-methyl-1-pentyn-3-ol (Aldrich)] in 2-butanone and 0.1 g of a 10% solution of a polymer crosslinker [PS120 (United Chemical Technologies)] in 2-butanone to 12.2 g of n-hexane. This formulation was coated at 11.2 ml/$M^2$ onto the subbing layer described above using a syringe pump and translating slot hopper. All samples were cured in an oven for 10 minutes at 100° C. after all layers were applied.

EXAMPLE 1

A polyethylene terephthalate support was coated with the subbing layer formulation, as described above, and allowed to dry at room temperature (about 2 μm dry thickness). Over the subbing layer was applied the thermally sensitive imaging layer formulation described above using Black Pearls 280 carbon black (Cabot) to provide a dried imaging layer having a thickness of about 0.15 μm. After curing for 10 minutes at 100° C., the resulting printing plate was imaged with a series of exposures ranging from 1500 mJ/$cm^2$ to 300 mJ/$cm^2$.

The exposed printing plate was printed with no further treatment or processing on the Heidelberg GTO press, as described above using the Kohl and Madden black waterless ink. Good image discrimination was observed even with the lowest exposure energy. The printing plate was negative working (that is, exposed areas accepted ink while unexposed areas remained ink-repellant). The image rolled up quickly and printed well for over a thousand sheets.

The supply of ink was then turned off and the printing plate was allowed to run dry. The ink was then changed to cyan ink noted above and the printing plate was used again for printing another 500 impressions. We observed that the imaging layer of the printing plate was not substantially worn at the end of the run.

EXAMPLE 2

A printing plate was prepared as described in Example 1 except PDMS PS 448 (United Chemical Technologies) was substituted for PS 255 in the subbing layer. The imaging and printing results where similar to those obtained with Example 1, but we observed somewhat cleaner backgrounds and slightly lower sensitivity.

EXAMPLE 3

A printing plate was prepared as described in Example 1 except that a 5% solution of IR absorber Dye 1 was included in the surface imaging layer formulation to yield 10 μg/$cm^2$ dry dye coverage. The resulting printing plate functioned as described in Example 1 but with somewhat lower sensitively.

EXAMPLE 4

A printing plate was prepared as described in Example 1 except that a 5% solution of IR DyeYKR30A (available from Yamamoto Chemicals, Inc.) was included in the surface imaging layer formulation to yield 10 μg.$cm^2$ dry dye coverage, and the crosslinking agent was increased by 60% before coating. Similar results were obtained as described in Example 3.

EXAMPLES 5–10

Several printing plates were prepared as described in Example 2 except the surface imaging layer coverage was reduced by 20% and carbon black was substituted as indicated in TABLE I below.

TABLE I

| Example | Carbon Black | Commercial Source |
|---|---|---|
| 5 | Black Pearl 280 | Cabot |
| 6 | Black Pearl 700 | Cabot |
| 7 | Regal 330 | Cabot |
| 8 | Raven 1200 | Columbian Chemicals |
| 9 | Raven 460 Ultra | Columbian Chemicals |
| 10 | TX-GR-160* | Nippon Shokubai Co. |

*Silicone-grafted carbon dispersion in toluene, as supplied.

The resulting printing plates were imagewise exposed and used for printing as described above. The results for these printing plates were similar to the Example 2 with the following exceptions. Example 7 exhibited somewhat more coating non-uniformity but had the highest sensitivity to laser exposure. Conversely, Example 10 exhibited the best coating uniformity but had the lowest sensitivity to laser exposure.

COMPARATIVE EXAMPLE 1

A printing plate was prepared as described in Example 1 except that the subbing layer was omitted. The thermally sensitive imaging layer was coated directly onto the support, cured, imagewise exposed and used for printing. This printing plate exhibited extreme background toning. The printed sheets where essentially black having only a faint hint of an image after about 200 impressions into the run.

COMPARATIVE EXAMPLE 2

A printing plate having a subbing layer as described in Example 2 was prepared and overcoated with 4 g of a 5% solution of the IR Dye YKR30A (no carbon black) in toluene added to 11 g of n-hexane. The resulting layers were dried, cured, imagewise exposed and used for printing as described above. The printing plate was not receptive to ink and exhibited clean sheets in both imaged and nonimaged areas.

The results described in the Examples of this invention indicate that is provides an imaging process that caused a chemical and/or physical "switching" wherein the surface layer was converted from an ink-repelling to an ink-accepting nature in the regions exposed to heat from the focused laser beam. The imaging and subbing layers were shown to have similar affinities for waterless ink in the unexposed condition. It was further demonstrated that the ink-repelling subbing layer used in the imaging members is necessary and capable of transmitting its superior ink-repelling nature through the relatively thin thermally sensitive surface imaging layer. It was also demonstrated that an imaging layer containing IR-sensitive dye alone is not sufficient to produce the necessary "switching" for desired ink-receptivity.

The invention has been described in detail with particular reference to preferred embodiments thereof, but it will be understood that variations and modifications can be effected within the spirit and scope of the invention.

We claim:

1. A thermal imaging member comprising a support having thereon:

(a) an ink-repellant subbing layer that is swellable in waterless ink solvents, and (b) an ink-repellant, thermally sensitive imaging layer that comprises a photothermal conversion material and a thermally sensitive copolymer comprising one or more silicone segments and one or more thermally sensitive "hard" segments, said silicone segments comprising from about 50 to about 99 weight % of the copolymer, said imaging layer being capable of becoming ink-accepting upon exposure to thermal energy.

2. The imaging member of claim 1 wherein said photothermal conversion material is an infrared radiation absorbing material.

3. The imaging member of claim 2 wherein said photothermal conversion material comprises a pigment.

4. The imaging member of claim 3 wherein said pigment is a carbon black.

5. The imaging member of claim 4 wherein said carbon black is a polymer-grafted or anionic surface-functionalized carbon black.

6. The imaging member of claim 2 wherein said photothermal conversion material comprises a mixture of a pigment and an infrared absorbing dye.

7. The imaging member of claim 1 wherein said support is a polyester or aluminum support.

8. The imaging member of claim 1 wherein said support is an on-press printing cylinder.

9. The imaging member of claim 1 wherein said thermally sensitive copolymer is represented by Structure I:

I $$—H—S—$$

wherein S represents a soft silicone segment, and H represents a hard segment, said S segments representing from about 50 to about 99 weight % of the total copolymer weight.

10. The imaging member of claim 9 wherein said H segments are derived from an acrylate, methacrylate, acrylic acid, methacrylic acid, cyanoacrylate, styrene, α-methylstyrene, vinyl ester, vinyl halide, vinylidene halide, maleic anhydride, maleimide, vinyl pyridine, olefm or a mixture of any of these.

11. The imaging member of claim 1 wherein said one or more silicone segments of said thermally sensitive copolymer are represented by Structure II, III or IV:

II

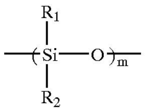

III

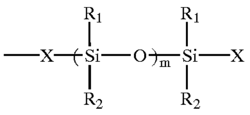

-continued

IV

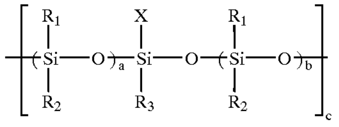

wherein m is from 5 to 10,000 and $R_1$ and $R_2$ are independently substituted or unsubstituted alkyl group of 1 to 20 carbons, substituted or unsubstituted aryl groups of 6 to 10 carbon atoms in the aromatic ring, or ether sequences having repeating oxyalkylene groups, X is a linking group, $R_3$ is the same as $R_1$ or $R_2$, c(a+b) designates the size of the silicone and c designates the number of pendant groups, wherein a, b, and c(a+b) is from 5 to 10,000.

12. The imaging member of claim 1 wherein said thermally sensitive copolymer is represented by Structure V:

V

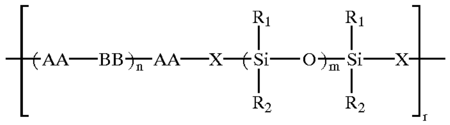

wherein AA and BB represent two difunctional monomers, r is at least 2, m is from 5 to 10,000, n is from 0 to 20, $R_1$ and $R_2$ are independently substituted or unsubstituted alkyl group of 1 to 20 carbons, substituted or unsubstituted aryl groups of 6 to 10 carbon atoms in the aromatic ring, or ether sequences having repeating oxyalkylene groups, and X is a linking group.

13. The imaging member of claim 1 wherein said thermally sensitive copolymer is represented by Structure VI or VII:

VI

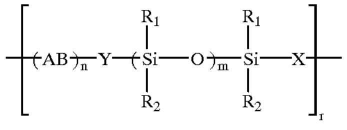

VII

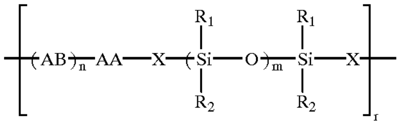

wherein X and Y represent terminal groups, AA and AB are derived from two difunctional monomers, r is at least 2, m is from 5 to 10,000, n is from 1 to 20, and $R_1$ and $R_2$ are independently substituted or unsubstituted alkyl group of 1 to 20 carbons, substituted or unsubstituted aryl groups of 6 to 10 carbon atoms in the aromatic ring, or ether sequences having repeating oxyalkylene groups.

14. The imaging member of claim 1 wherein said thermally sensitive copolymer is represented by Structure VIII:

VIII

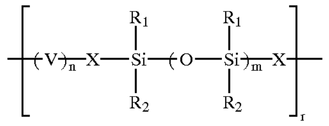

wherein V is derived from a cyclic ether, lactam, lactone, oxazoline, acetaldehyde or phthalaldehyde monomer, X is a linking group, r is at least 2, m is from 5 to 10,000, n is from 1 to 20, and $R_1$ and $R_2$ are independently substituted or unsubstituted alkyl group of 1 to 20 carbons, substituted or unsubstituted aryl groups of 6 to 10 carbon atoms in the aromatic ring, or ether sequences having repeating oxyalkylene groups.

19. The imaging member of claim 1 further comprising an adhesion-promoting layer between said support and said subbing layer.

20. The imaging member of claim 1 wherein said subbing layer comprises a silicone polymer.

21. A thermal imaging member comprising a support having thereon:

(a) an ink-repellant subbing layer that is swellable in waterless ink solvents, and (b) an ink-repellant, thermally sensitive imaging layer that comprises a photothermal conversion material and a thermally sensitive copolymer comprising one or more silicone segments and one or more thermally sensitive "hard" segments, said silicone segments comprising from about 50 to about 99 weight % of the copolymer, said imaging layer being capable of becoming ink-accepting upon exposure to thermal energy, wherein said thermally sensitive copolymer is represented by Structure X:

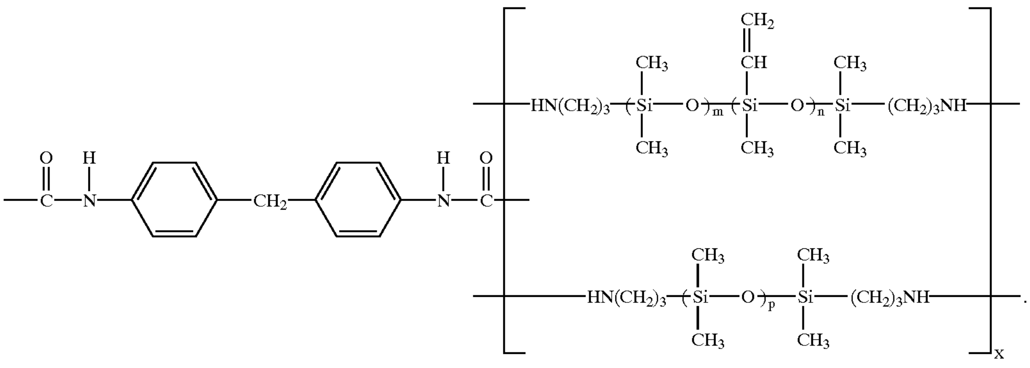

15. The imaging member of claim 1 wherein said thermally sensitive copolymer is represented by Structure IX:

IX

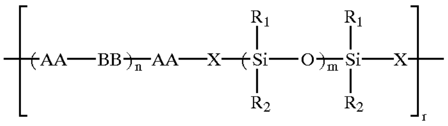

wherein AA is a diisocyanate, BB is a diol, n is 0 to 3, r is at least 2, $R_1$ and $R_2$ are methyl groups, X is $—CH_2CH_2CH_2NH_2$, and m is from 5 to 10,000.

16. The imaging member of claim 1 wherein said photothermal conversion material is present in an amount sufficient to provide an optical density of at least 0.3.

17. The imaging member of claim 1 wherein said imaging layer has a dry thickness of from about 0.01 to about 5 μm, and said subbing layer has a dry thickness of from about 0.05 to about 20 μm.

18. The imaging member of claim 17 wherein said imaging layer has a dry thickness of from about 0.04 to about 0.5 μm, and said subbing layer has a dry thickness of from about 1 to about 5 μm.

22. A method of imaging comprising:

A) providing the imaging member of claim 21, and

B) imagewise exposing said imaging layer of said imaging member to thermal energy to provide exposed and unexposed areas in said imaging layer whereby said exposed areas are rendered more oleophilic than said unexposed areas by said thermal energy.

23. The method of claim 22 wherein said imagewise exposing is carried out using an IR radiation emitting laser.

24. The method of claim 22 wherein said imagewise exposing is carried out using a thermoresistive head.

25. The method of claim 22 wherein said imaging member is provided in A by spraying formulations for said subbing and imaging layers onto a cylindrical support.

26. A method of printing comprising:

A) providing the imaging member of claim 21,

B) imagewise exposing said surface layer of said imaging member to thermal energy to provide exposed and unexposed areas in said imaging layer whereby said exposed areas are rendered more oleophilic than said unexposed areas by said thermal energy, and C) inking said imaging layer and transferring said ink to a receiving material.

* * * * *